United States Patent
Zhou et al.

(12)

(10) Patent No.: US 6,287,979 B1
(45) Date of Patent: Sep. 11, 2001

(54) METHOD FOR FORMING AN AIR GAP AS LOW DIELECTRIC CONSTANT MATERIAL USING BUCKMINSTERFULLERENE AS A POROGEN IN AN AIR BRIDGE OR A SACRIFICIAL LAYER

(75) Inventors: Mei-Sheng Zhou; Simon Chooi, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/550,265

(22) Filed: Apr. 17, 2000

(51) Int. Cl.$^7$ ................................................. H01L 21/00
(52) U.S. Cl. .................... 438/723; 216/67; 438/735; 438/743
(58) Field of Search ....................... 438/692, 723, 438/735, 743; 216/67, 88

(56) References Cited

U.S. PATENT DOCUMENTS

| | | | |
|---|---|---|---|
| 5,461,003 | 10/1995 | Havemann et al. | 437/187 |
| 5,510,645 | 4/1996 | Fitch et al. | 257/522 |
| 5,597,444 | 1/1997 | Gilton | 156/643.1 |
| 5,744,399 | 4/1998 | Rostoker et al. | 438/622 |
| 5,750,415 | 5/1998 | Gnade et al. | 437/195 |

*Primary Examiner*—William A. Powell
(74) *Attorney, Agent, or Firm*—George O. Saile; Rosemary L. S. Pike; William J. Stoffel

(57) ABSTRACT

A method for reducing RC delay by forming an air gap between conductive lines. A sacrificial layer is formed over a semiconductor structure, filling the gaps between conductive lines on the semiconductor structure. An air bridge layer is formed over the sacrificial layer. The semiconductor structure is exposed to an oxygen plasma, which penetrates through pores in the air bridge layer to react with the sacrificial layer, whereby the sacrificial layer is removed through the air bridge layer. The sacrificial layer and/or the air bridge layer comprise buckminsterfullerene. The air bridge layer can comprise buckminsterfullerene incorporated in an inorganic spin-on material. The buckminsterfullerene reacts with the oxygen plasma and is removed to form a porous air bridge layer. Then the oxygen species from the plasma penetrate the porous air bridge layer to react with and remove the sacrificial layer. The sacrificial layer can comprise buckminsterfullerene incorporated in an inorganic spin-on material, or the sacrificial layer can consist solely of buckminstefullerene. The buckminsterfullerene reacts with the oxygen plasma and is removed through the pores in the air bridge layer.

29 Claims, 2 Drawing Sheets

US 6,287,979 B1

METHOD FOR FORMING AN AIR GAP AS LOW DIELECTRIC CONSTANT MATERIAL USING BUCKMINSTERFULLERENE AS A POROGEN IN AN AIR BRIDGE OR A SACRIFICIAL LAYER

CROSS REFERENCE TO RELATED APPLICATIONS

The co-assigned U.S. patent application, Ser. No. 09/550,264, filed on Apr. 17, 2000 and currently pending before the United States Patent and Trademark Office is included herein by reference.

BACKGROUND OF INVENTION

1) Field of the Invention

This invention relates generally to fabrication of a semiconductor device and more particularly to a method for forming an air gap as a low dielectric constant material between conductive lines or interconnects using Buckminsterfullerene as a porogen in an air bridge or dielectric material.

2) Description of the Prior Art

In aluminum and copper damascene BEOL interconnects, the reduction of the RC delay is a key design driver. The introduction of low dielectric constant (low-K) materials is one way of reducing the capacitance of the delay, and thereby reducing the delay. The ideal low-K material for reducing RC delay is air. However, introducing air as the dielectric material between metal lines presents processing difficulties.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,744,399 (Rostoker et al.) teaches a process for lowering the dielectric constant of an insulating layer by incorporating a fullerene within an organic or an inorganic matrix (e.g. composite layer) This patent teaches that the fullerenes can be removed to form pores which reduce the dielectric constant of the remaining matrix. This patent teaches that the preferred method for removing fullerenes is by using a liquid solvent, although an oxygen plasma is suggested as a possible alternative. However this patent does not disclose or suggest the use of fullerenes in an organic spin-on layer as a sacrificial layer or as a sacrificial layer consisting solely of fullerenes. This patent teaches away from the present invention, teaching that fullerene should be used in a mixture with a matrix material. Nor does this patent disclose or suggest the use of an air bridge. U.S. Pat. No. 5,510,645 (Fitch et al.) teaches a method for forming an air gap using a selective etch process to remove a sacrificial spacer.

U.S. Pat. No. 5,461,003 (Havemann et al.) shows a method for forming an air gap by removing a disposable solid layer, preferably photoresist through a porous dielectric layer using an oxygen plasma.

U.S. Pat. No. 5,750,415 (Gnade et al.) shows a method for forming an air gap by removing a disposable liquid through a porous silica precursor film.

U.S. Pat. No. 5,597,444 (Gilton) shows an etching method using a plasma comprising a mixture of a carbon compound, including buckminsterfullerene, and a halogen.

Buckminsterfullerenes (e.g. fullerenes, bucky balls) are a naturally occurring form of carbon named for Buckminster Fuller, the architect of the geodesic dome. Fullerenes can contain from 32 to 960 carbon atoms, and are all believed to have the structure of a geodesic dome. Sixty-carbon fullerenes and seventy-carbon fullerenes are highly stable molecules.

SUMMARY OF THE INVENTION

It is an object of the present invention to provide a method for forming an air gap using a sacrificial spin-on layer comprising buckminsterfullerene as a porogen in an inorganic matrix which is removed through an air bridge using an oxygen plasma to form the air gap.

It is another object of the present invention to provide a method for forming an air gap using buckminsterfullerene as a porogen in an air bridge layer, and using an oxygen plasma to remove the buckminsterfullerene from the air bridge layer, creating a porous air bridge, and to remove a reactive organic layer through the air bridge to form an air gap.

It is another object of the present invention to reduce RC delay in a semiconductor device by forming an air gap or air tunnel between adjacent conductive lines, such as interconnects, using buckminsterfullerene as a porogen according to any of the preceding objects.

It is yet another object of the present invention to provide a method for forming an air gap using buckminsterfullerene as a porogen in a sacrificial spin-on layer and in an air bridge.

To accomplish the above objectives, the present invention provides a method for reducing RC delay by forming an air gap between conductive lines, using buckminsterfullerene as a porogen in a sacrificial layer and/or in a composite air bridge layer. A porogen is a material which can be removed to leave a pore or gap in the remaining structure. An air bridge is a porous layer, through which a gas or liquid (in this invention an oxygen plasma) can penetrate, reacting with an underlying layer.

The present invention begins by providing a semiconductor structure having conductive lines thereon, wherein the conductive lines have a gap there between. An optional oxide liner can be formed over the semiconductor structure and conductive lines. A sacrificial layer is formed over the semiconductor structure, filling the gaps. An air bridge layer is formed over the sacrificial layer. The semiconductor structure is exposed to an oxygen plasma, whereby the sacrificial layer is removed through the air bridge layer.

In a first embodiment of the present invention, the sacrificial layer comprises buckminsterfullerene incorporated in an inorganic spin-on material, resulting in a partial air gap, or the sacrificial layer consists of buckminsterfullerene alone, resulting in a total air gap. In the first embodiment, the air bridge layer can be a porous film as is known in the art.

In the second embodiment of the present invention, the air bridge layer comprises buckminsterfullerene incorporated in an inorganic spin-on layer, such as HSQ. When the semiconductor structure is exposed to an oxygen plasma, the buckminsterfullerene is removed from the air bridge layer, forming a porous air bridge layer. The oxygen species in the plasma (e.g. radicals, atoms, ions) penetrate the porous layer and reacts with an underlying sacrificial layer, preferably comprising a reactive organic material, and the sacrificial layer is removed through the porons air bridge layer.

The present invention provides considerable improvement over the prior art. An air gap can be formed using spin-on and oxygen plasma treatment processes which are well known, easily controlled, and readily available in semiconductor manufacturing. Also, the present invention does not present the difficulty of working with a sacrificial liquid or the problem of shrinkage associated with other air bridge processes.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for reducing RC delay by forming an air gap between conductive lines using buckminsterfullerene as a porogen in an air bridge layer and/or in a sacrificial layer.

First Preferred Embodiment—Buckminsterfullerene Sacrificial Layer

Figure 1:
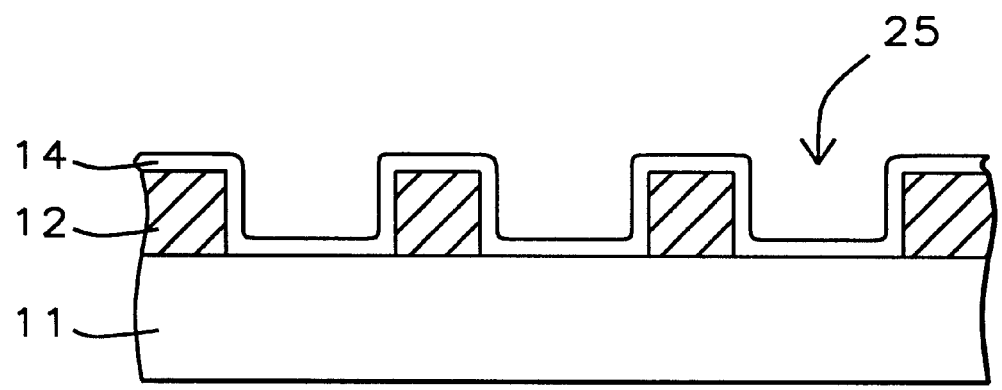
FIGS. 1 through 4 illustrate sequential sectional views of a process for forming an air gap according to the present invention.

Referring to FIG. 1, the first preferred embodiment of the present invention begins by providing a semiconductor structure (11). Semiconductor structure (11) should be understood to possibly include a wafer or substrate comprising a substrate material such as monocrystalline silicon, a silicon-on-insulator (SOI) structure, an epitaxial silicon structure, or any of a number of other like structures known in the art. Semiconductor structure (11) should be understood to possibly further include one or more conductive layers and insulating layers and/or one or more active and passive devices formed on or over such wafer or substrate together with conductive lines and contact holes connecting such devices. The semiconductor structure (11) has conductive lines (12), such as interconnects, thereon, with gaps (25) between the conductive lines. The conductor in the conductive lines (12) can comprise one or more of the following: aluminum, aluminum-copper alloy, aluminum-silicon-copper alloy, tungsten, copper, titanium, titanium nitride, titanium-tungsten, or any other suitable conductive material known in the art. An optional dielectric liner (14), comprising silicon nitride, or more preferably silicon oxide can be deposited over the conductive lines (12) and semiconductor structure (11). The dielectric layer (14) preferably has a thickness of between about 100 angstroms and 5000 angstroms. The dielectric liner (14) promotes or improves adhesion of a subsequently deposited sacrificial layer, as well as preventing corrosion of the conductive lines (12) which would occur upon contact with trace moisture from a sacrificial layer and/or air gap layer.

Figure 2:
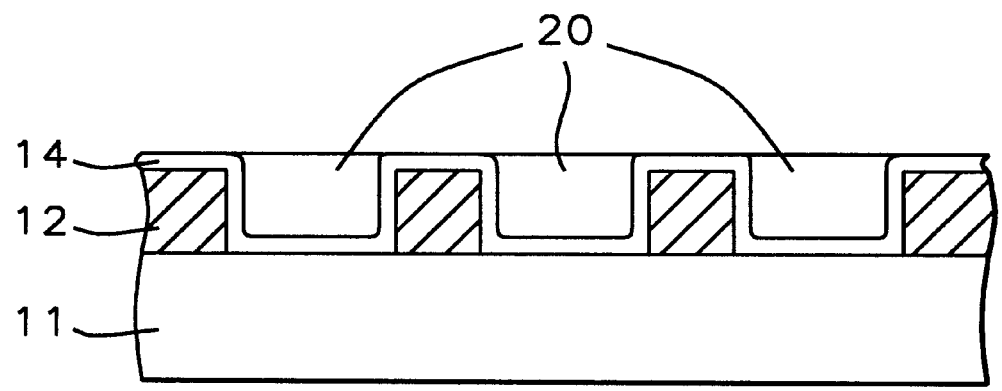

Referring to FIG. 2, a sacrificial layer (20) is formed over the semiconductor structure (11), filling the gaps (25) between the conductive lines (12). In the first embodiment, the sacrificial layer (20) can comprise buckminsterfullerene, which will be removed to provide an air gap. The first embodiment has two options: the first provides a full air gap and the second provides a partial air gap with a residual porous structure remaining.

Option 1—Total Air Gap

In the first option of the first embodiment (total or full air gap), sacrificial layer 20 consists of buckminsterfullerene that is wholly the reactive material. When the sacrificial layer (20) of the first option is exposed to an oxygen plasma, the sacrificial layer is completely removed, resulting in a total air gap 14 (e.g. nothing but air between the conductive lines 12).

The sacrificial layer (20) consists of buckminsterfullerene that is wholly the reactive material. It can be deposited by evaporation or sublimation of the buckminsterfullerene onto the wafer. A crucible containing the buckminsterfullerene is heated by inductive or RF coils to between 300° C. and 1000° C. Alternatively, a beam of electrons can be directed to the center of the buckminsterfullerene in the crucible. Another method of depositing the sacrificial layer is chemical vapor deposition, wherein the buckminsterfullerene is heated above 400° C., carried into the chamber as a vapor, and deposited onto the wafer. Yet another method of depositing the sacrificial layer is to spin coat a hexane solution containing the buckminsterfullerene, followed by removal of the hexane.

An optional film densification treatment (curing) can be performed in a furnace or a rapid thermal anneal (RTA) equipment at a temperature of between 50° C. and 500° C. and a pressure of between about 400 torr and 765 torr. An optional planarization step can also be performed using a CMP or more preferably an etchback process. The etching chemistry of the etchback comprises one or more of the following gasses: nitrogen, hydrogen, forming gas (mixture of nitrogen and hydrogen), argon, oxygen, fluorine, chlorine, or boron trichloride.

Alternatively, in option one of the first preferred embodiment, the sacrificial layer can comprise buckminsterfullerene incorporated in an organic spin-on material or polymer, such as a poly(arylene)ether, such that both the the buckminsterfullerene and the organic spin-on material are removed by a subsequent oxygen plasma treatment, leaving a total air gap.

For a sacrificial layer comprising buckminsterfullerene incorporated in an organic spin-on material, the buckminsterfullerene preferably comprises between about 2% and 90%, by volume, of the sacrificial layer. The sacrificial layer can be formed using a spin-coating and/or sol-gel process at a temperature of between about 20° C. and 50° C., at a spin rate of between about 50 rev/min and 5000 rev/min, at a pressure of between about 600 torr and 765 torr. Following spin-coating, the composite sacrificial layer can be heat treated (baked) on the hot plates within the spin coater at a temperature of between about 50° C. and 350° C. Then, the composite sacrificial layer can undergo a densification treatment (curing) in a furnace or in a RTA equipment at a temperature of between about 300° C. and 450° C. and at a pressure of between about 400 torr and 765 torr. An optional planarization of the sacrificial layer can be performed using a CMP or more preferably etchback process. The etching chemistry of the etchback comprises one or more of the following gasses: nitrogen, hydrogen, forming gasses (mixture of nitrogen and hydrogen), argon, oxygen, fluorine, chlorine, or boron trichloride.

Option 2—Partial Air Gap

In option two of the first embodiment, the sacrificial layer (20) can comprise buckmisterfullerene incorporated in an inorganic spin-on material, such as hydrogen-silsesquioxane spin-on glass (HSQ-SOG), silicate spin-on glass, doped silicate spin-on glass (e.g. borosilicates or phosphosilicates), or porous silicon oxide (e.g. silica gel, xerogel) or porous entity of any inorganic spin-on material.

Alternatively, in option two of the first embodiment, the sacrificial layer (20) can comprise buckminsterfullerene incorporated in a carbon-doped silicon oxide spin-on material, such as an allyl or aryl siloxane, silsesquioxane, or sililane. These compounds typically transform into silicon oxide upon treatment with oxygen plasma.

The buckminsterfullerene preferably comprises between about 2% and 90%, by volume, of the sacrificial layer. The sacrificial layer can be formed using a spin-coating and/or sol-gel process at a temperature of between about 20° C. and 50° C., at a spin rate of between about 50 rev/min and 5000 rev/min, at a pressure of between about 600 torr and 765 torr. Following spin coating, the composite sacrificial layer can be heat treated (baked) on the hot plates within the spin coater at a temperature of between about 50° C. and 350° C. Then, the composite sacrificial layer can undergo a densification treatment (curing) in a furnace or in a RTA equipment at a temperature of between about 300° C. and 450° C. and at a pressure of between about 400 torr and 765 torr. An optional planarization of the sacrificial layer can be performed using a CMP or more preferably etchback process. The etching chemistry of the etchback comprises one or more of the following gasses: nitrogen, hydrogen, forming gasses (mixture of nitrogen and hydrogen), argon, oxygen, fluorine, chlorine, or boron trichloride.

An important property of the sacrificial layer (20) of the second option, comprising inorganic spin-on material or carbon-doped silicon oxide, is that the inorganic spin-on material or carbon-doped silicon oxide is not removed in a subsequent oxygen plasma, but remains when the buckminsterfullerene spheres are removed. The remaining inorganic spin-on material or carbon doped silicon oxide provides structural support, and the removal of the buckminsterfullerene provides air gaps within the inorganic spin-on material.

Air Bridge Layer—Both Options of Embodiment

Figure 3:
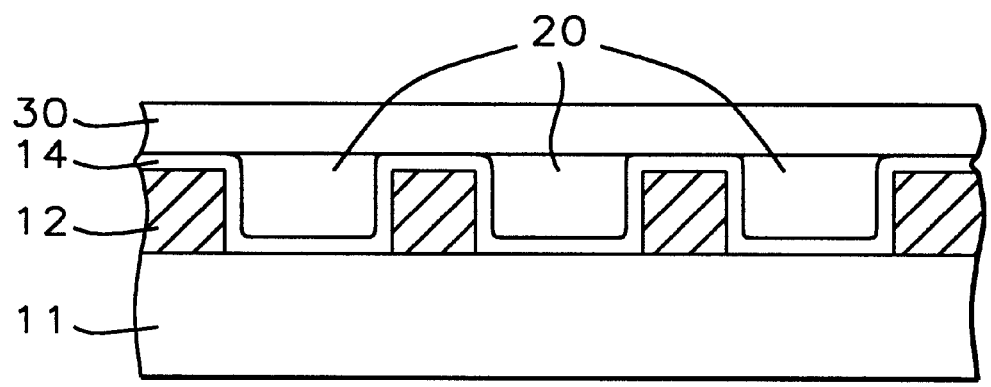

Referring to FIG. 3, an air bridge layer (30) is formed over the dielectric layer (20). In the first embodiment the air bridge layer comprises a porous material as is known in the art, such as porous silicon oxide or porous hydrogen silsesquioxane formed using a spin-coating, chemical vapor deposition, or sol-gel process. The air bridge layer (30) preferably has a thickness of between about 50 Angstroms and 5000 Angstroms with pores comprising between about 1% and 90% of the total volume of the air bridge layer. The pores allow a subsequent oxygen plasma to penetrate through the air bridge layer (30) to the underlying sacrificial layer (20).

Alternatively, the air bridge layer (30) can be a dual metal-oxide layer as outlined in commonly assigned, co-pending application CS99-153.

Figure 4:
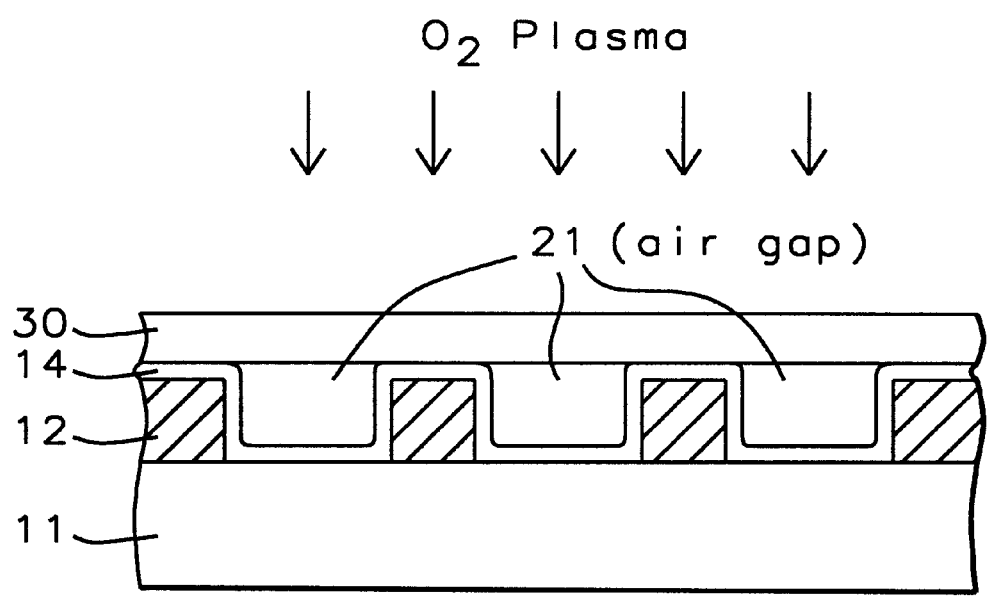

Referring to FIG. 4, the semiconductor structure (11) is exposed to an oxygen plasma treatment, to form gap 21, whereby the buckminsterfullerene in the sacrificial layer (20) reacts with the oxygen species (e.g. radicals, molecules) in the plasma to form carbon dioxide and/or carbon monoxide which is removed through the air bridge layer (30). The oxygen plasma treatment is preferably performed at a temperature of between about 30° C. and 500° C., at a pressure of between about 0.1 torr and 30 torr, and an oxygen flow rate of between about 100 sccm and 30,000 sccm. Forming gas (nitrogen with about 4% hydrogen) may be added to enhance the dissociation of oxygen. A power of between about 100 watts and 2000 watts can be used if RF or microwave is capacitatively coupled to the plasma.

In option 1, where the sacrificial layer is comprised wholly of buckminsterfullerene, or in an organic spin-on coating, such as poly(arylene)ether, the sacrificial layer 20 is completely removed. The resulting air gap 21, is a total air gap with no structural support. In option 2, where the sacrificial layer comprises buckminsterfullerene incorporated in an inorganic spin-on coating or an organic spin-on coating, such as an alkyl or aryl siloxane, silsesquioxane, or silizane, only the buckminsterfullerene in the sacrificial layer 20 is removed. The resulting air gap 21, has air gaps where the buckminsterfullerene was removed, with a porous structure comprising the organic or inorganic spin-on coating.

Second Preferred Embodiment—Buckminsterfullerene Air Bridge

Referring to FIG. 1, the second preferred embodiment of the present invention begins by providing a semiconductor structure (11). Semiconductor structure (11) should be understood to possibly include a wafer or substrate comprising a substrate material such as monocrystalline silicon, a silicon-on-insulator (SOI) structure, an epitaxial silicon structure, or any of a number of other like structures known in the art. Semiconductor structure (11) should be understood to possibly further include one or more conductive layers and insulating layers and/or one or more active and passive devices formed on or over such wafer or substrate together with conductive fines and contact holes connecting such devices. The semiconductor structure (11) has conductive lines (12), such as interconnects, thereon, with gaps (25) between the conductive lines. The conductor in the conductive lines (12) can comprise one or more of the following: aluminum, aluminum-copper alloy, aluminum-silicon-copper alloy, tungsten, copper, titanium, titanium nitride, titanium-tungsten, or any other suitable conductive material known in the art. An optional dielectric liner (14), comprising silicon nitride, or more preferably silicon oxide can be deposited over the conductive lines (12) and semiconductor structure (11). The dielectric layer (14) preferably has a thickness of between about 100 angstroms and 5000 angstroms. The dielectric layer (14) promotes or improves adhesion of a subsequently deposited sacrificial layer, as well as preventing corrosion of the conductive lines (12) which would occur upon contact with trace moisture from a sacrificial layer and/or air gap layer.

Referring to FIG. 2, a sacrificial layer (20) is formed over the semiconductor structure (11), filling the gaps (25) between the conductive lines (12). In the second embodiment, the sacrificial layer (20) can comprise a reactive organic material, such as but not restricted to poly (arylene)ether (e.g. FLARE manufactured by Allied Signal), polyimide, or photoresist. The sacrificial layer (20) is preferably formed using a spin-coating process.

Following spin-coating, the sacrificial layer can be heat treated (baked) on the hot plates within the spin coater at a temperature of between about 50° C. and 350° C. Then, the sacrificial layer can undergo a densification treatment (curing) in a furnace or in a RTA equipment at a temperature of between about 300° C. and 450° C. and at a pressure of between about 400 torr and 765 torr. An optional planarization of the sacrificial layer can be performed using a CMP or more preferably etchback process. The etching chemistry of the etchback comprises one or more of the following gasses: nitrogen, hydrogen, forming gasses (mixture of nitrogen and hydrogen), argon, oxygen, fluorine, chlorine, or boron trichloride.

Referring to FIG. 3, a composite air bridge layer (30) is formed over the dielectric layer (20). In the second embodiment the air bridge layer preferably comprises an inorganic spin-on material such as HSQ, undoped silicate, or doped silicate (e.g. phosposilicate, borosilicate) with buckminsterfullerene incorporated therein. The air bridge layer (30) preferably has a thickness of between about 50 Angstroms and 5000 Angstroms with buckminsterfullerene comprising between about 2% and 80% of the total weight of the air bridge layer, or between about 2% and 80% of the total volume of the air bridge layer.

Referring to FIG. 4, the semiconductor structure (1) is exposed to an oxygen plasma treatment, whereby the buckminsterfullerene in the air bridge layer (30) reacts with the oxygen species (e.g. radicals, molecules) in the plasma and is removed, causing the air bridge layer to become porous. The oxygen species then penetrate the porous air bridge layer, reacting with the sacrificial layer, which is removed through the porous air bridge layer (30). The oxygen plasma treatment is preferably performed at a temperature of between about 30° C. and 500° C., at a pressure of between about 0.1 torr and 30 torr. Forming gas (nitrogen with about 4% hydrogen) may be added to enhance the dissociation of oxygen. A power of between about 100 watts and 2000 watts can be used if RF or microwave is capacitatively coupled to the plasma.

Third Preferred Embodiment—
Buckminsterfullerene Sacrificial and Air Gap Layers

In the third preferred embodiment, both the sacrificial layer and the air bridge layer comprise buckminsterfullerene. Referring to FIG. 1, the third preferred embodiment of the present invention begins by providing a semiconductor structure (11) having conductive lines (12), such as interconnects, thereon, with gaps (25) between the conductive lines, as in the first and second embodiments. An optional dielectric liner (14), comprising silicon nitride, or more preferably silicon oxide can be deposited over the conductive lines (12) and semiconductor structure (11) as in the first and second embodiment.

Referring to FIG. 2, a sacrificial layer (20) is formed over the semiconductor structure (11), filling the gaps (25) between the conductive lines (12). In the third embodiment, the sacrificial layer (20) comprises buckminsterfullerene, which will be removed to provide an air gap. The third embodiment has two options: a fill air gap and a partial air gap with a residual porous structure remaining, both of which as described under the first preferred embodiment.

Referring to FIG. 3, a composite air bridge layer (30) is formed over the dielectric layer (20). In the third embodiment the air bridge layer preferably comprises an inorganic spin-on material such as HSQ, undoped silicate, or doped silicate (e.g. phosposilicate, i borosilicate) with buckminsterfullerene incorporated therein, as described under the second preferred embodiment.

Referring to FIG. 4, the semiconductor structure (11) is exposed to an oxygen plasma treatment, whereby the buckminsterfullerene in the air bridge layer (30) reacts with the oxygen species (e.g. radicals, molecules) in the plasma and is removed, causing the air bridge layer to become porous. The oxygen species then penetrate the porous air bridge layer, reacting with the sacrificial layer, which also comprises buckminsterfullerene. The buckminsterfullerene in the sacrificial layer is removed through the porous air bridge layer (30). The oxygen plasma treatment is preferably performed at a temperature of between about 30° C. and 500° C., at a pressure of between about 0.1 torr and 30 torr. Forming gas (nitrogen with about 4% hydrogen) may be added to enhance the dissociation of oxygen. A power of between about 100 watts and 2000 watts can be used if RF or microwave is capacitatively coupled to the plasma.

In all three embodiments of the present invention, it is preferable that dummy interconnect structures (e.g. lines, round blocks, or square blocks) be placed in any wide gaps between adjacent conductors such that the gap width is reduced to less than 1 micron.

The key advantages of the present invention are that an air gap can be formed using spin-on and oxygen plasma treatment processes which are well known, easily controlled, and readily available in semiconductor manufacturing. Also, the present invention does not present the difficulty of working with a sacrificial liquid or the problem of shrinkage associated with other air bridge processes.

While the invention has been particularly shown and described with reference to the preferred embodiments thereof, it will be understood by those skilled in the art that various changes in form and details may be made without departing from the spirit and scope of the invention.

What is claimed is:
1. A method for forming an air gap, comprising the steps of:
   a. providing a semiconductor structure; said semiconductor structure having conductive lines thereon; said conductive lines having a gap therebetween;
   b. forming a sacrificial layer over said semiconductor structure; said sacrificial layer comprising buckminsterfullerene;
   c. forming an air bridge layer over said sacrificial layer; said air bridge layer comprising a porous film; and
   d. performing an oxygen plasma treatment on said semiconductor structure; whereby said buckminsterfullerene reacts with the oxygen species in the plasma and is removed through said air bridge layer.

2. The method of claim 1 wherein said sacrificial layer is an inorganic spin-on polymer with buckminsterfullerene incorporated therein.

3. The method of claim 1 wherein said sacrificial layer consists of buckminsterfullerene.

4. The method of claim 1 wherein said sacrificial layer comprises a carbon-doped silicon oxide spin-on polymer with buckminsterfullerene incorporated therein.

5. The method of claim 1 wherein said sacrificial layer comprises an organic spin-on polymer with buckminsterfullerene incorporated therein.

6. The method of claim 1 wherein said gap between said conductive lines has a width of less than 1 micron.

7. A method for forming an air gap, comprising the steps of:
   a. providing a semiconductor structure; said semiconductor structure having conductive lines thereon; said conductive fines having a gap there between;
   b. forming a liner layer, comprising silicon oxide over said conductive lines,
   c. formiing a sacrificial layer over said semiconductor structure; said sacrificial layer comprising buckminsterfullerene;

d. forming an air bridge layer over said sacrificial layer; said air bridge layer comprising a porous film; and e. performing an oxygen plasma treatment on said semiconductor structure; whereby said buckminsterfullerene reacts with the oxygen species in the plasma and is removed through said air bridge layer.

8. The method of claim 7 wherein said sacrificial layer is an inorganic spin-on polymer with buckminstefullerene incorporated therein.

9. The method of claim 7 wherein said sacrificial layer consists of buckminsterfullerene.

10. The method of claim 7 wherein said sacrificial layer comprises a carbon-doped silicon oxide spin-on polymer with buckiminsterfullerene incorporated therein.

11. The method of claim 7 wherein said sacrificial layer comprises an organic spin-on polymer with buckminsterfullerene incorporated therein.

12. A method for forming an air gap, comprising the steps of:

a. providing a semiconductor structure; said semiconductor structure having conductive lines thereon; said conductive lines having a gap there between;

b. forming a sacrificial layer over said semiconductor structure;

c. forming an air bridge layer over said sacrificial layer; said air bridge layer comprising buckminsterfullerene; and d. performing an oxygen plasma treatment on said semiconductor structure; whereby said buckminsterfullerene reacts with the oxygen species in the plasma and is removed forming a porous film, and said sacrificial layer is removed through said porous film, forming an air gap.

13. The method of claim 12 wherein said sacrificial layer is an inorganic spin-on polymer with buckminsterfullerene incorporated therein.

14. The method of claim 12 wherein said sacrificial layer consists of buckminsterfullerene.

15. The method of claim 12 wherein said sacrificial layer comprises a carbon-doped silicon oxide spin-on polymer with buckminsterfullerene incorporated therein.

16. The method of claim 12 wherein said sacrificial layer comprises an organic spin-on polymer with buckminsterfullerene incorporated therein.

17. The method of claim 12 wherein said air bridge layer is an inorganic spin-on polymer with buckminsterfullerene incorporated therein.

18. The method of claim 12 wherein said gap between said conductive lines has a width of less than 1 micron.

19. The method of claim 12 wherein said air bridge layer comprises between about 1% and 80% by weight of buckrninsterfiillerene.

20. The method of claim 17 wherein said air bridge layer comprises between about 1% and 80% by weight of buckminsterfullerene.

21. A method for forming an air gap, comprising the steps of:

a. providing a semiconductor structure; said semiconductor structure having conductive lines thereon; said conductive lines having a gap there between;

b. forming a liner layer, comprising silicon oxide over said conductive lines;

c. forming a sacrificial layer over said semiconductor structure;

d. forming an air bridge layer over said sacrificial layer; said air bridge layer comprising buckminsterfullerene; and e. performing an oxygen plasma treatment on said semiconductor structure; whereby said buckminsterfullerene reacts with the oxygen species in the plasma and is removed forming a porous film, and said sacrificial layer is removed through said porous film, forming an air gap.

22. The method of claim 21 wherein said sacrificial layer is an inorganic spin-on polymer with buckminsterfullerene incorporated therein.

23. The method of claim 21 wherein said sacrificial layer consists of buckminsterfullerene.

24. The method of claim 21 wherein said sacrificial layer comprises a carbon-doped silicon oxide spin-on polymer with buckminsterfullerene incorporated therein.

25. The method of claim 21 wherein said sacrificial layer comprises an organic spin-on polymer with buckminsterfullerene incorporated therein.

26. The method of claim 21 wherein said air bridge layer is an inorganic spin-on polymer with buckminsterfullerene incorporated therein.

27. The method of claim 21 wherein said gap between said conductive lines has a width of less than 1 micron.

28. The method of claim 21 wherein said air bridge layer comprises between about 1% and 80% by weight of buckminsterfullerene.

29. The method of claim 26 wherein said air bridge layer comprises between about 1% and 80% by weight of buckminsterfullerene.

* * * * *